US006578156B1

United States Patent
Sugita

(10) Patent No.: US 6,578,156 B1
(45) Date of Patent: Jun. 10, 2003

(54) OUTPUT BUFFER HAVING A PLURALITY OF SWITCHING DEVICES BEING TURNED ON SUCCESSIVELY AT SHORTER TIME INTERVALS TO ACHIEVE INCREASING DRIVE CAPABILITY USING A PREDRIVER

(75) Inventor: Natsuki Sugita, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/479,443

(22) Filed: Jan. 7, 2000

(30) Foreign Application Priority Data

| Jan. 8, 1999 | (JP) | ................................. 11-002911 |
| Oct. 29, 1999 | (JP) | ................................. 11-309215 |
| Dec. 24, 1999 | (JP) | ................................. 11-366095 |

(51) Int. Cl.⁷ .................. G06F 1/04; H03K 19/0175; H03K 19/0185
(52) U.S. Cl. ............... 713/502; 713/500; 713/330; 326/83; 326/87; 327/100; 327/112; 327/322
(58) Field of Search .................. 713/300, 330, 713/400, 500, 501, 502, 600; 327/100, 112, 322; 326/83, 87

(56) References Cited

U.S. PATENT DOCUMENTS 5,003,205 A * 3/1991 Kohda et al. ............... 326/83

5,149,994 A * 9/1992 Neu .......................... 327/322
5,621,342 A * 4/1997 Wong et al. ................ 327/112
5,929,668 A * 7/1999 Kim .......................... 327/112
5,994,922 A * 11/1999 Aoki et al. .................. 326/83
6,133,767 A * 10/2000 Caesar et al. ............... 327/112

FOREIGN PATENT DOCUMENTS

| EP | 0452648 A1 * 3/1991 | ....... H03K/19/0175 |
| JP | 06-132807 | 5/1994 |
| JP | 06-311017 | 11/1994 |

* cited by examiner

Primary Examiner—Thomas Lee
Assistant Examiner—James K. Trujillo
(74) Attorney, Agent, or Firm—Hogan & Hartson, LLP

(57) ABSTRACT

An output drive circuit of an output buffer circuit has a signal output line and first, second and third switching circuits connected to the signal output line at different locations thereof. Each of the first, second and third switching circuits includes one of first switching devices connected between a power source line and the signal output line, and one of second switching devices connected between the signal output line and a ground line. Each of the first, second and third switching circuits includes one of first control signal lines that turn on and off the first switching devices, respectively, and one of second control signal lines that turn on and off the second switching devices, respectively. Drivabilities of the first and/or the second switching devices in the switching circuits are set to gradually increase in a specified order.

15 Claims, 12 Drawing Sheets

OUTPUT BUFFER HAVING A PLURALITY OF SWITCHING DEVICES BEING TURNED ON SUCCESSIVELY AT SHORTER TIME INTERVALS TO ACHIEVE INCREASING DRIVE CAPABILITY USING A PREDRIVER

BACKGROUND OF THE INVENTION

1. Field of the Invention

The present invention relates to an output buffer circuit that is suitable for outputting a signal at a low transfer speed, and a master slice type semiconductor device and an electronic apparatus using the output buffer circuit.

2. Description of Related Art

Universal Serial Bus (USB) is a known standard for connecting a personal computer to peripherals. Details of the standard are described in the Universal Serial Bus Specification Revision 1.0.

The USB standard specifies two different data transfer speeds, namely, a full speed (at 12 Mbps) and a low speed (at 1.5 Mbps). The USB standard also specifies electrical characteristics required by an output buffer circuit for low speed, in which the rise time and the fall time of the waveform of an output are specified to be within a range of 75–300 ns for a wide range of load capacitances ranging from 50 to 350 pf.

Conventionally, an output buffer circuit that realizes the low transmission speed of the USB is composed of a bias voltage circuit using resistors and an output driver circuit using a feedback by the capacitance. This structure is disclosed to the public by the Intel Corporation in the U.S.

FIG. 14 is a circuit diagram of a conventional common output buffer circuit that realizes the low transmission speed of the USB. A bias voltage generation circuit 400 is composed of P-type MOS transistors 401 and 402, resistors R1 and R2, and N-type MOS transistors 403 and 404. The bias voltage generation circuit 400 generates three types of bias voltages when an enable signal 410 is at a low level.

An output driver circuit 420 is composed of comparators 421 and 422, a capacitance C, P-type MOS transistors 423–426, and N-type MOS transistors 427–430. The P-type MOS transistor 426 and the N-type MOS transistor 430, that are provided at an output stage and form a CMOS transistor, are turned on and off by input signals 412 and 414, respectively. The comparators 421 and 422 and the capacitance C form an output feed back circuit, and control changes in output voltages.

The output buffer circuit shown in FIG. 14 requires high precision in the resistors R1 and R2 and the capacitor C. Therefore, it is difficult to form the output buffer circuit by gate arrays, and conventionally, a custom design is required to realize an output buffer circuit.

Further, circuit tuning of the output buffer circuit shown in FIG. 14 is difficult. Accordingly, conventional output buffer circuits that achieve the low data transfer speed of the USB require a great number of process steps and costs.

SUMMARY OF THE INVENTION

It is therefore an object of the present invention to provide an output buffer circuit that brings the rise time and the fall time of an output signal within a predetermined range for a wide range of capacitance loads, without using resistors or capacitors. It is also an object of the present invention to provide a master slice type semiconductor device and an electronic apparatus using the output buffer circuit.

An output buffer circuit in accordance with one embodiment of the present invention comprises a signal output line and a plurality of switching circuits connected to the signal output line at different locations thereof. Each of the plurality of switching circuits comprises a first switching device connected between a power source line and the signal output line, a second switching device connected between the signal output line and a ground line, a first control signal line that turns the first switching device on and off, and a second control signal line that turns the second switching device on and off. The first switching device and the second switching device in one of the plurality of switching circuits have a minimum current drivability, and the first switching device and the second switching device in another of the plurality of switching circuits have a maximum current drivability.

In accordance with the embodiment, all of the second switching devices are turned off, and the first switching devices are successively turned on in the order from one having a lower current drivability. As a result, the signal level on the signal output line can rise smoothly within a specified time range, when the load capacitance coupled to the signal output line is either low or high. On the other hand, all of the first switching devices are turned off, and the second switching devices are successively turned on in the order from one having a lower current drivability. As a result, the signal level on the signal output line can fall smoothly within a specified time range, when the load capacitance coupled to the signal output line is either low or high. Compared to a circuit that has a pair of switching circuits or a plurality of switching circuits having the same current drivability, the present invention is more effective in implementing a smooth transition of the signal level, and in controlling the signal transition time to be within a predetermined time range for both a low load capacitance and a high load capacitance.

In accordance with one embodiment of the present invention, the plurality of switching circuits may further include another switching circuit composed of the first switching device and the second switching device having a current drivability equal to the minimum current drivability, the maximum current drivability or a current drivability between the minimum current drivability and the maximum current drivability.

By increasing the number of switching circuits, the signal level can be changed more smoothly for both the low load capacitance and the high load capacitance.

In accordance with one embodiment of the present invention, each of the first switching device and the second switching device disposed in each of the plurality of switching circuits is composed of at least one P-type MOS transistor and at least one N-type MOS transistor, respectively, that compose a CMOS transistor.

In this case, the CMOS transistors in the respective switching circuits may be provided with different sizes to achieve the different current drivabilities.

Also, the CMOS transistor in at least one of the plurality of switching circuits has a low current drivability that is attained by connecting a plurality of the P-type MOS transistors and/or the N-type MOS transistors in series to one another. Alternatively, the CMOS transistor in at least one of the plurality of switching circuits has a high current drivability that is attained by connecting a plurality of the P-type MOS transistors and/or the N-type MOS transistors in parallel with one another.

In accordance with one embodiment, the output buffer circuit may be further provided with a predriver circuit that supplies a control signal to the first control signal line and the second control signal line connected to each of the plurality of switching circuits based on an input signal and a clock signal. When the potential on the output signal line is turned to a high level, the predriver circuit turns off all the second switching devices in the plurality of switching circuits and simultaneously turns on the first switching device in the switching circuit having the minimum current drivability. Subsequently, it turns on the first switching devices in the other switching circuits in the order from one having a lower current drivability.

When the potential of the output signal line is turned to a low level, the predriver circuit turns off all the first switching devices in the plurality of switching circuits and simultaneously turns on the second switching device in the switching circuit having the minimum current drivability. Subsequently, it turns on the second switching devices in the other switching circuits in the order from one having a lower current drivability.

An enable signal may be inputted in the predriver circuit. When the enable signal is non-active, the first and the second switching devices in all of the switching circuits are simultaneously turned off to set the signal output line in a high impedance. In this case, the signal output line of the output buffer circuit can be connected to an input/output terminal.

The predriver circuit may have a sift-register composed of a plurality of serially connected D-type flip-flops corresponding to the plurality of switching circuits. The shift-register transmits a change in the input signal, based on clocks synchronized with the clock signal, from one of the D-type flip-flops in the first stage to one of the D-type flip-flops in the last stage. A control signal, that is generated based on an output from the D-type flip-flop in the first stage and the enable signal, is supplied to the first and the second control signal lines of the switching circuit having the minimum drivability. The first and the second control signal lines of each of the switching circuits other than the switching circuit having the minimum drivability are provided with a control signal that is generated based on an output from the D-type flip-flop in the first stage, an output from a corresponding one of the D-type flip-flops and the enable signal.

The predriver circuit thus composed can drive the output drive circuits of the output buffer circuit at the timing described above.

The plurality of switching devices are successively turned on at specified time intervals. At least the last one of the time intervals is shorter than the first one of the time intervals. As an example, a normal phase and a reverse phase of a clock are respectively inputted in adjacent two of the D-type flip-flops, such that a signal shift operation between the two D-type flip-flops takes place in a half cycle of the clock. By implementing the above-described measure in the switching circuit having a high current drivability and its corresponding D-type flip-flops, the signal level on the signal output line can be changed more smoothly.

An input signal that is inputted in the predriver circuit in accordance with the present invention can be transmitted at a data transmission speed of 1.5 Mbps that is a low transmission speed according to the USB standard.

In this instance, a clock frequency of the clock signal may preferably be 12 MHz. This is because the rise time and the fall time of a signal in the case of the load capacitance being 50–350 pf may readily be limited within a range of 75–300 ns, the range that is specified in the USB standard, without using an expensive crystal oscillator that may be required for a higher frequency. Also, in this instance, the number of the switching circuits may preferably be 5 or less. When six or more switching circuits are used, it is difficult to achieve the time shorter than the upper limit of 300 ns.

In accordance with another embodiment of the present invention, a master slice type semiconductor device is formed from a master slice having a plurality of pre-formed transistors of different sizes being wired with one another that includes the output buffer circuit described above.

The output buffer circuit in accordance with the present invention, high precision resistances or capacitors may not be required. Accordingly, an output buffer circuit can be composed by wiring a plurality of transistors having different sizes that are pre-formed on a master slice.

In accordance with still another embodiment of the present invention, an electronic apparatus is composed by using therein the master slice type semiconductor device described above. The electronic apparatus includes, in addition to a personal computer, peripheral devices for the personal computer including man-machine interface devices, such as keyboards, mouse devices and the like, and relay devices such as hubs and the like.

The electronic apparatus may further comprises a high-speed output buffer circuit that transfers data at 12 Mbps that is a high transmission speed specified in the USB standard, a high-speed logic circuit that generates a signal to be outputted through the high-speed output buffer circuit, an oscillator that generates a clock frequency (for example, 48 MHz) to be supplied to the high-speed logic circuit, and a first frequency divider that divides an output from the oscillator to generate a clock frequency (for example, 12 MHz) that matches with the operation of the low-speed output buffer circuit having the above-described structure. The electronic apparatus further comprises a logic circuit that supplies a logic signal to the above-described low-speed output buffer circuit, and a second frequency divider that further divides an output from the first frequency divider to generate a clock frequency (for example, 6 MHz) that matches with the logic circuit.

Other features and advantages of the invention will be apparent from the following detailed description, taken in conjunction with the accompanying drawings that illustrate, by way of example, various features of embodiments of the invention.

DESCRIPTION OF PREFERRED EMBODIMENTS

Embodiments of the present invention will be described below with reference to the accompanying drawings.

Figure 1:
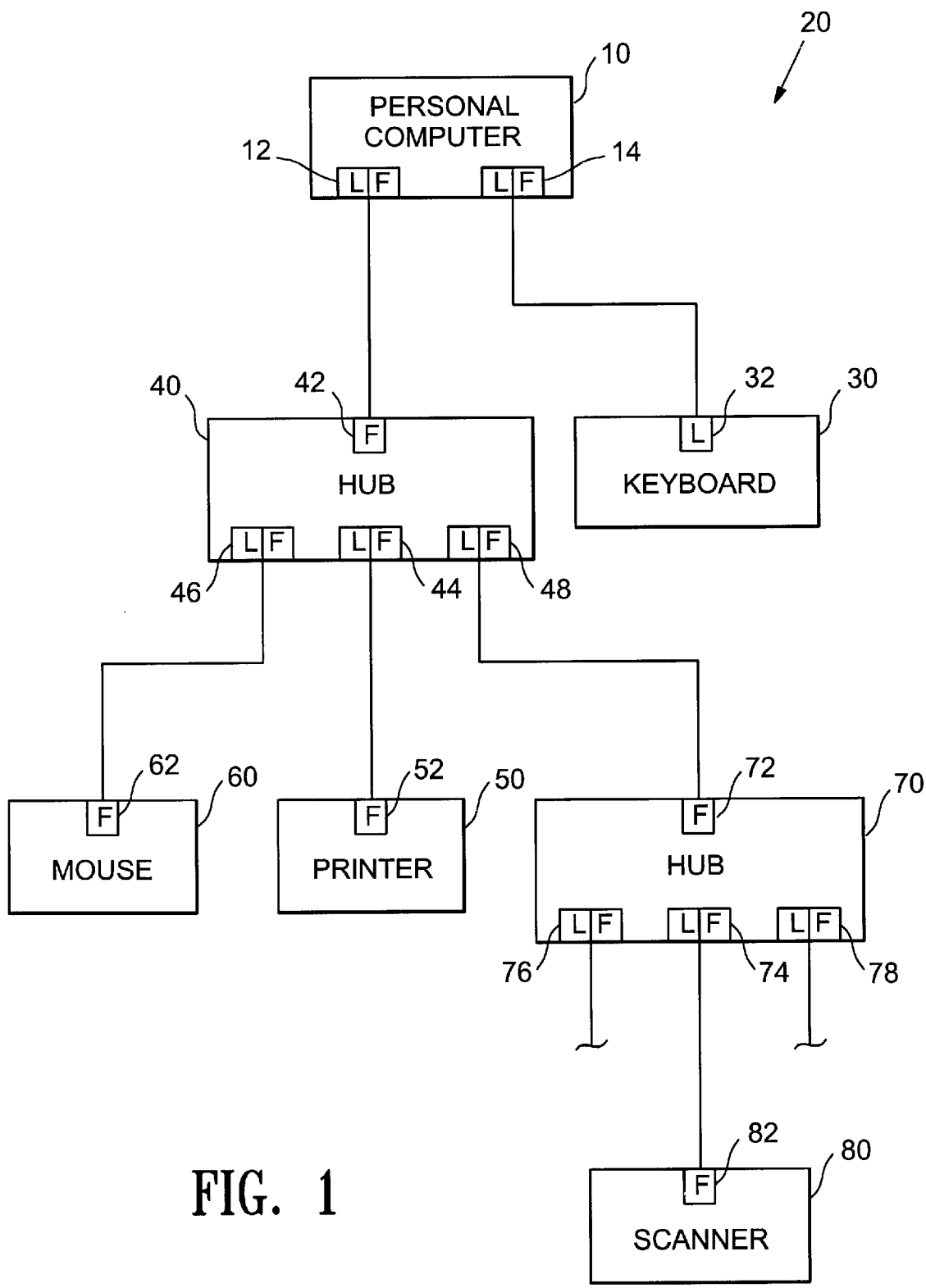
FIG. 1 shows a diagram of connected electronic apparatuses in which the present invention is applied.

FIG. 1 is a block diagram showing connections between various electronic devices that include output buffer circuits in accordance with one embodiment of the present invention.

Referring to FIG. 1, peripheral devices 20, such as, for example, a keyboard 30, a hub 40, a printer 50, a mouse 60, a hub 70 and a scanner 80 are connected to a personal computer 10.

An input/output buffer circuit 12 and an input/output buffer circuit 14 are provided in the personal computer 10. The keyboard 30 has an input/output buffer circuit 32. The hub 40 has input/output buffer circuits 42–48, and the hub 70 has input/output buffer circuits 72–78. The printer 50 has an input/output buffer circuit 52, the mouse 60 has an input/output buffer circuit 62, and the scanner 80 has an input/output buffer circuit 82.

Element "F" shown in each of the buffers refers to a buffer that transfers signals at full speed of the USB (at 12 Mbps). Element "L" refers to a buffer that transfers signals at low speed of the USB (at 1.5 Mbps).

Among the peripheral devices 20 shown in FIG. 1, the keyboard 30 and the mouse 70 are man-machine interface devices that transfer output signals at the low speed of the USB. The printer 50 and the scanner 80 transfer output signals at the full speed of the USB. The hubs 40 and 70 that relays signals between the personal computer 10 and its peripheral devices include both of the "L" and "F" buffers, such that the hubs 40 and 70 can selectively handle both full speed signals and low speed signals depending on the speed of signals. The input/output buffer circuits 42 and 72 disposed at upstream ports of the respective hubs 40 and 70 transfer signals at full speed of the USB.

Other man-machine interface devices other than the keyboard 30 and the mouse 60, such as a game pad and the like may output signals in response to human operations. Therefore, such interface devices may operate at a low data transmission speed to be sufficiently responsive. Because of the low data transmission speed, strict electromagnetic interference (EMI) countermeasures are not required, and thus the transmission cable can be made thinner.

Output buffer circuits in accordance with the present invention are applicable in output buffer circuits that transfer signals at low speed (including output buffer circuits in input/output buffer circuits).

Figure 2:
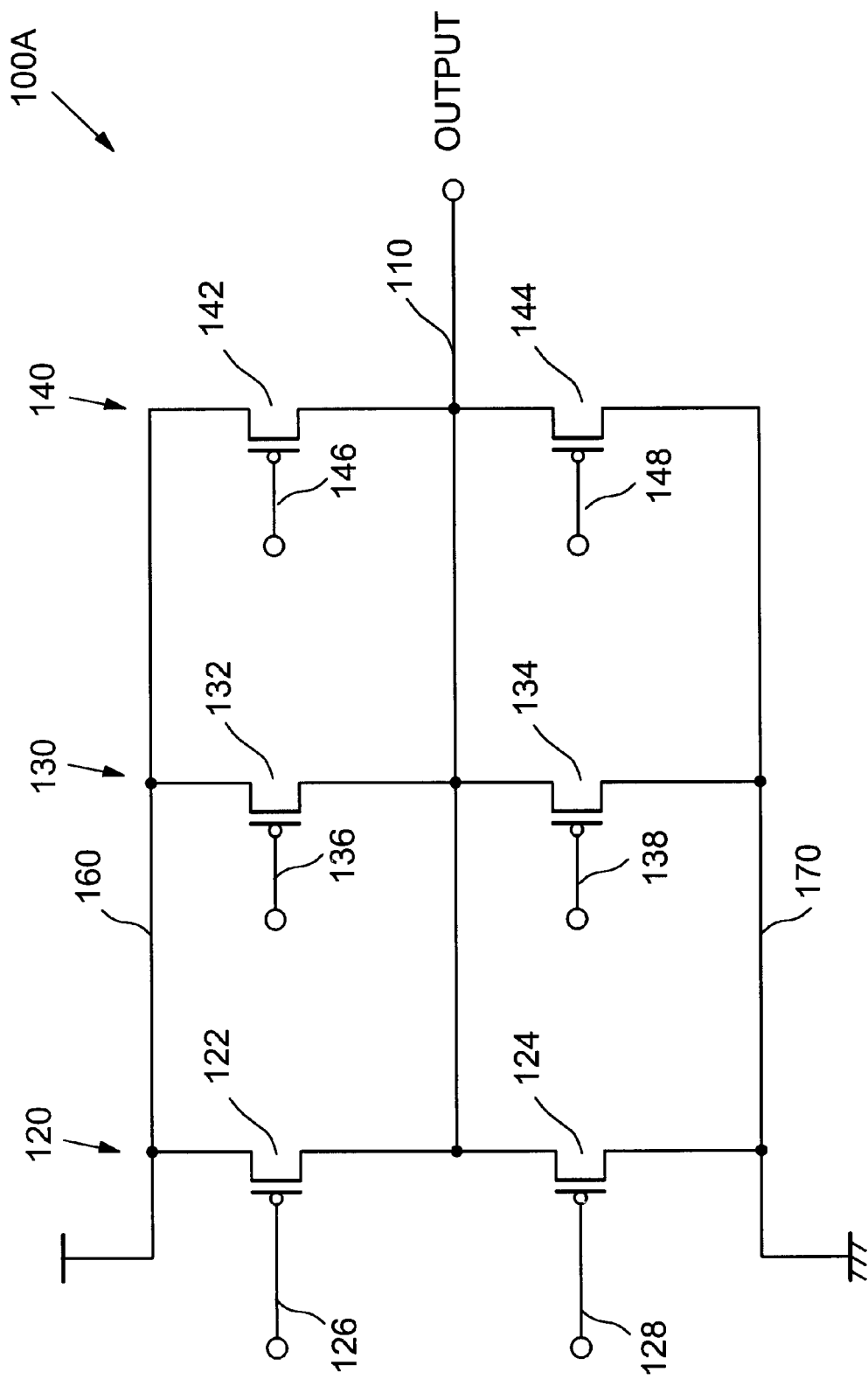
FIG. 2 shows a circuit diagram of an output drive circuit of an output buffer circuit in accordance with a first embodiment of the present invention.

FIG. 2 shows an example of an output drive circuit 100A that is provided in an output buffer circuit (including an output buffer circuit in an input/output buffer circuit) that performs data transmission at low speed in FIG. 1. The output drive circuit 100A shown in FIG. 2 includes a signal output line 110, and first, second and third switching circuits 120, 130 and 140 that are connected to the signal output line 110 at different locations thereof. Each of the first, the second and the third switching circuits 120, 130 and 140 is formed from a CMOS transistor.

The first, the second and the third switching circuits 120, 130 and 140 have first switching devices, namely, P-type MOS transistors 122, 132 and 142, respectively, that are connected between a power source line 160 and the signal output line 110, and second switching devices, namely, N-type MOS transistors 124, 134, 144, respectively, that are connected between the signal output line 110 and a ground line 170. Gates of the P-type MOS transistors 122, 132 and 142 and the N-type MOS transistors 124, 134 and 144 connect to control signal lines 126, 136, 146, 128, 138 and 148, respectively, that independently turn the respective transistors on and off.

The P-type MOS transistors 122, 132 and 142 provided in the first, the second and the third switching circuits 120, 130 and 140 have current drivabilities that are different from one another. Also, the N-type MOS transistors 124, 134 and 144 have mutually different current drivabilities.

Referring to FIG. 2, the current drivabilities of the first switching circuit 120, the second switching circuit 130 and the third switching circuit 140 become greater in this order. In other words, when the P-type MOS transistors 122, 132 and 142 have current drivabilities, P1, P2 and P3, respectively, and the N-type MOS transistors 124, 134 and 144 have current drivabilities, N1, N2 and N3, respectively, the following relations are established: P1<P2<P3, and N1<N2<N3.

In order to differentiate the current drivabilities from one transistor to another, the gate width and/or the gate length may be changed. In accordance with one embodiment of the present invention, for example, gate widths of the P-type MOS transistors 122, 132 and 142, in the CMOS transistors of the switching circuits 120, 130 and 140, become greater in this order. Also, the gate widths of the N-type MOS transistors 124, 134 and 144 become greater in this order.

Referring to FIG. 2, the first, the second and the third switching circuits 120, 130 and 140 are arranged in the order from one having a lower current drivability. However, they may be disposed in any order. Rather, the order of switching timing to turn the transistors on and off is important.

Figure 3:
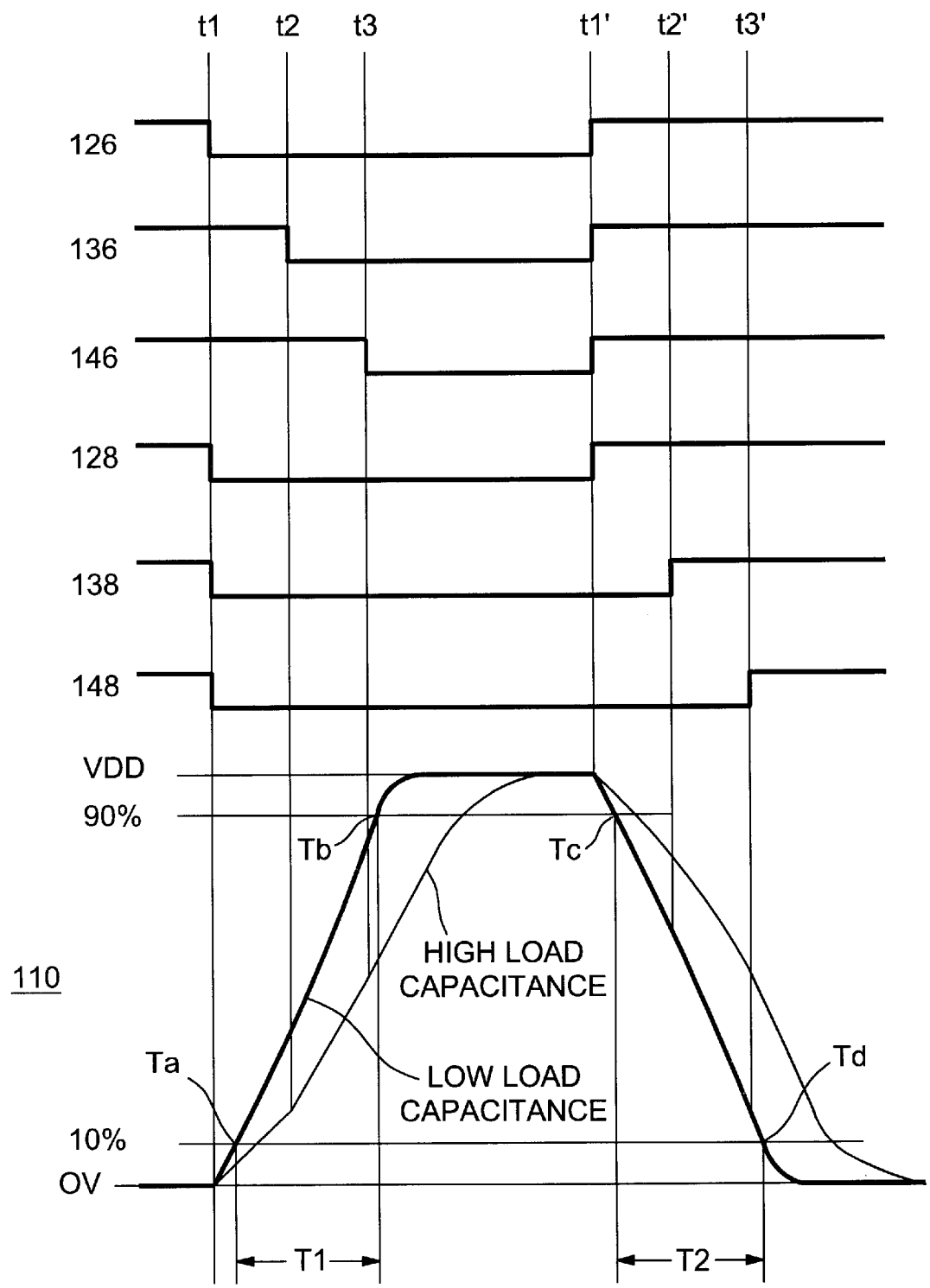
FIG. 3 is a timing chart of the output drive circuit shown in FIG. 2.

FIG. 3 shows waveforms that are inputted in the control signal lines 126, 128, 136, 138, 146 and 148 shown in FIG. 2, and the resultant signal levels on the output signal line 110.

First, the description will be made for the case when the signal level on the output signal line 110 is shifted from low level to high level. In an initial state, signals on the control signal lines 126, 136 and 146 that are supplied to the gates of the P-type MOS transistors 122, 132 and 142 are at a high level. Signals on the control signal lines 128, 138 and 148 that are supplied to the gates of the N-type MOS transistors 124, 134 and 144 are at a high level. Signal on the output signal line 110 is at a low level.

First, all signal levels on the control signal lines 128, 138 and 148 that are connected to the gates of the N-type MOS transistors 124, 134 and 144 are simultaneously shifted from high level to low level at time t1. As a result, the N-type MOS transistors 124, 134 and 144 are simultaneously turned off.

At the same time, the signal level on the control signal line 126 is shifted from a high level to a low level, such that only the P-type MOS transistor 122 having the smallest current drivability among the three P-type MOS transistors is turned on.

Then, at time t2, the signal level on the control signal line 136 is changed from a high level to a low level, such that only the P-type MOS transistor 132 having the intermediate current drivability among the three P-type MOS transistors is turned on.

Lastly, at time t3, the signal level on the control signal line 146 is changed from a high level to a low level, such that only the P-type MOS transistor 142 having the largest current drivability among the three P-type MOS transistors is turned on. By this operation, the total current drivability of the P-type MOS transistors in the output drive circuit 100A is gradually increased to thereby shift the signal level on the output signal line 110 from a low level to a high level.

Next, the description will be made for the case when the signal level on the output signal line 110 is shifted from a high level to a low level.

First, all signal levels on the control signal lines 126, 136 and 146 that are connected to the gates of the P-type MOS transistors 122, 132 and 142 are simultaneously shifted from a low level to a high level at time t1'. As a result, the P-type MOS transistors 122, 132 and 142 are simultaneously turned off.

At the same time, the signal level on the control signal line 128 is shifted from a low level to a high level, such that only the N-type MOS transistor 124 having the smallest current drivability among the three N-type MOS transistors is turned on.

Then, at time t2', the signal level on the control signal line 138 is changed from a low level to a high level, such that only the N-type MOS transistor 134 having the intermediate current drivability among the three N-type MOS transistors is turned on.

Lastly, at time t3', the signal level on the control signal line 148 is changed from a low level to a high level, such that only the N-type MOS transistor 144 having the largest current drivability among the three N-type MOS transistors is turned on. By this operation, the total current drivability of the N-type MOS transistors in the output drive circuit 100A is gradually increased to thereby shift the signal level on the output signal line 110 from a high level to a low level.

FIG. 3 shows different voltage level shifts of voltages on the output signal line 110 that are obtained by the operation described above, when a low load capacitance and a high load capacitance are connected to the signal output line 110, respectively.

In the case of the low load capacitance, the voltage level on the signal output line 110 can be changed mainly by a current that is supplied through the P-type MOS transistor 122 that has the smallest current drivability and turns on first. Subsequently, the current drivability is gradually increased, such that the voltage level on the signal output line 110 is relatively smoothly shifted.

On the other hand, in the case of the high load capacitance, the voltage level on the signal output line 110 can be changed mainly by a current that is supplied through the P-type MOS transistor 142 that has the largest current drivability and turns on last. Before the transistor 142 turns on, the current drivability is gradually increased, such that the voltage level on the signal output line 110 is relatively smoothly shifted.

The signal level on the output signal line 110 needs to be shifted as described above because of the following reasons.

One of the reasons is to bring the rise time and the fall time of the signal level within a predetermined time range for both low loads and high loads.

As shown in FIG. 3, the rise time of the signal level is determined by time T1 between time Ta when the signal level reaches 10% of the wave height and time Tb when the signal level reaches 90% of the wave height. Similarly, the fall time of the signal level is determined by time T2 between time Tc when the signal level reaches 90% of the wave height and time Td when the signal level reaches 10% of the wave height.

In the present embodiment, the current drivability is gradually increased. As a result, the rise time T1 and the fall time T2 in the case of low loads, and the rise time T1 and the fall time T2 in the case of high loads can be limited within a predetermined standard range, for example, within a range of 75–300 ns for low speed transmission of the USB. As a result, even when a logic circuit, that operates at a signal level on the signal output line 110, is operated with high frequency clocks, malfunctions thereof attributable to delays in changes of the signal level can be prevented.

Another of the reasons is to provide EMI countermeasures. If changes of the signal level on the signal output line 110 are not smooth and its waveform is skewed, noises are generated.

In accordance with the embodiment of the present invention, the current drivability is gradually increased. As a consequence, the signal level change takes place more smoothly, and the generation of noises is reduced for both low loads and high loads.

Figure 4:
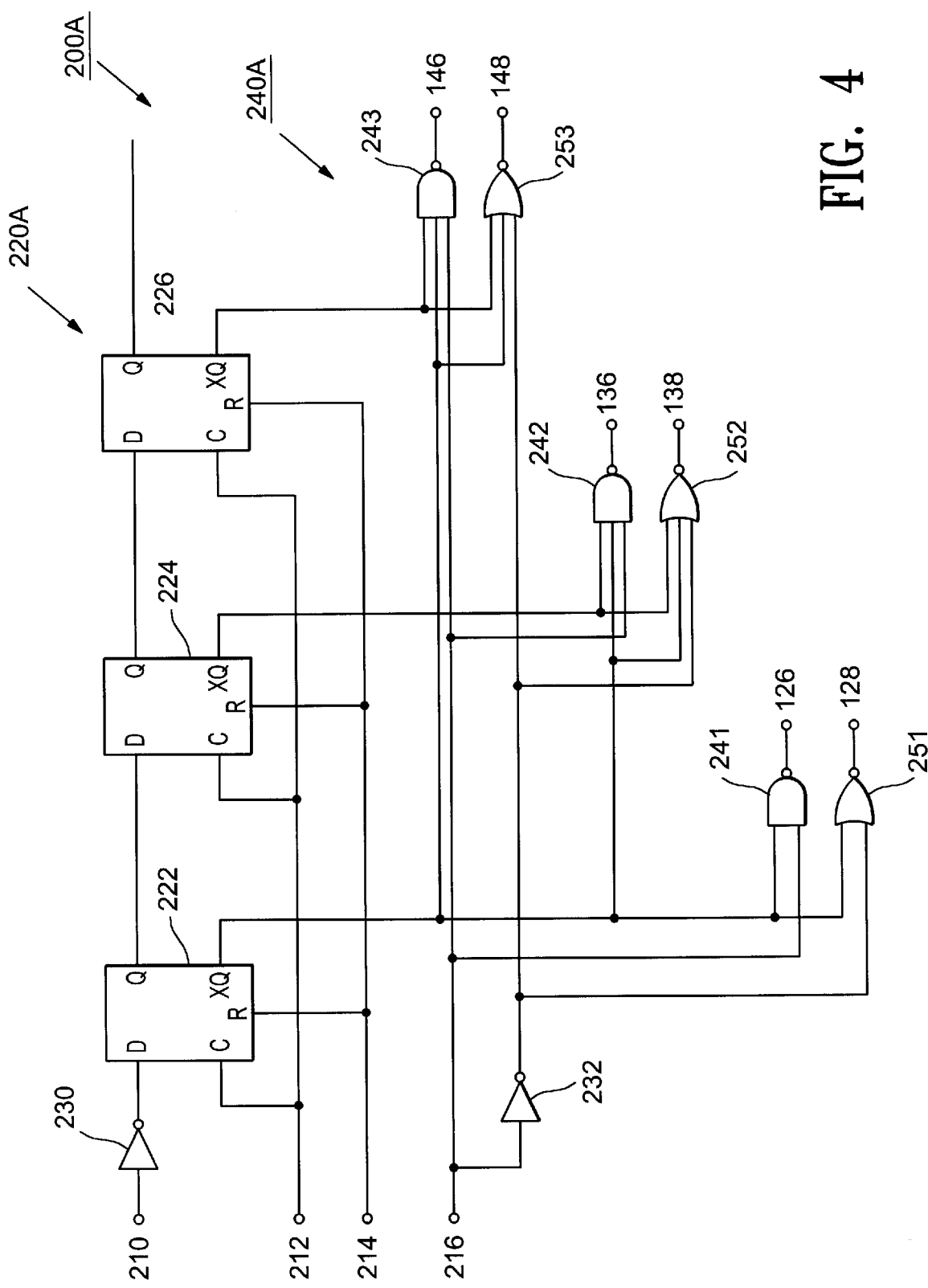
FIG. 4 shows a circuit diagram of a predriver circuit that can be used in pair with an output drive circuit shown in FIG. 2, in accordance with a second embodiment of the present invention.
Figure 5:
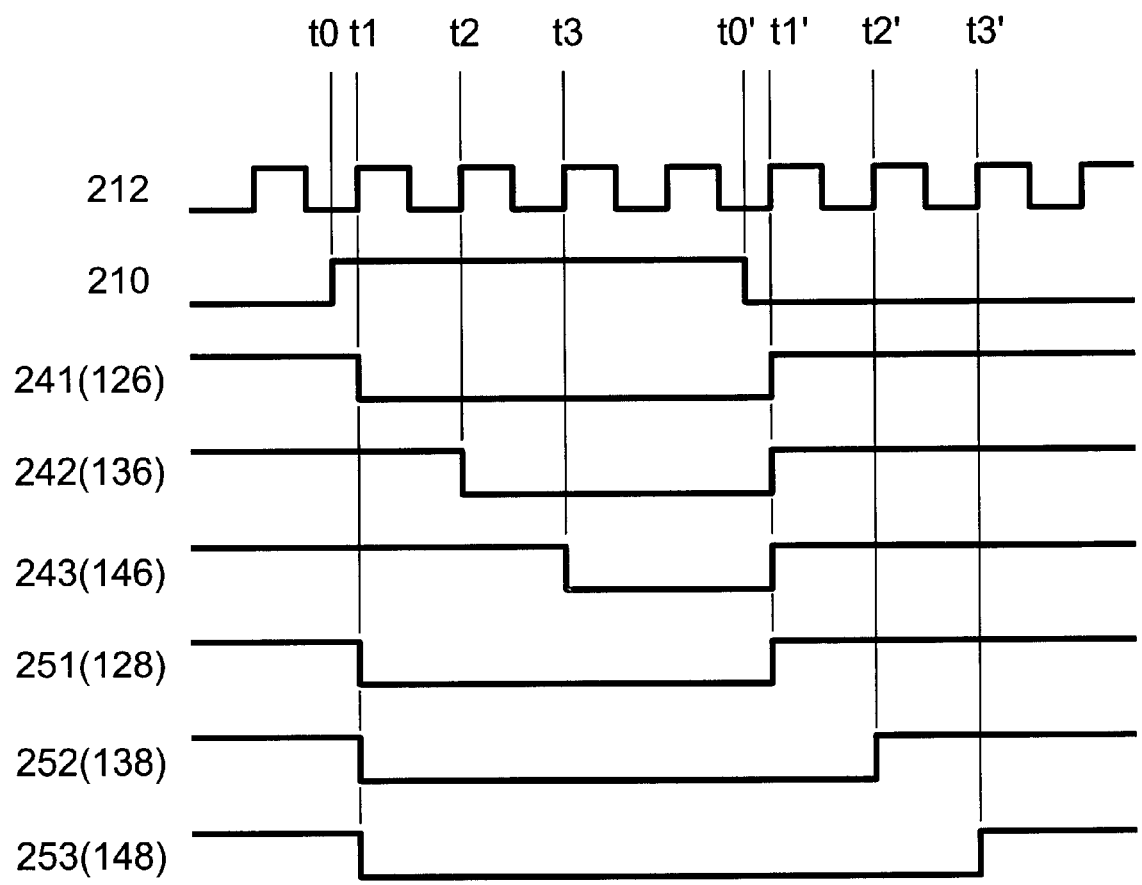
FIG. 5 is a timing chart of an operation of the predriver circuit shown in FIG. 4.

FIG. 4 shows a circuit diagram of a predriver circuit 200A that is used in pair with the output drive circuit 100A shown in FIG. 2. FIG. 5 is a timing chart of the operation of the predriver circuit 200A.

The predriver circuit 200A supplies control signals to the control signal lines 126, 128, 136, 138, 146 and 148 shown in FIG. 2, based on an input signal 210, a clock signal 212, a reset signal 214 and an enable signal 216.

The predriver circuit 200A generally has a shift register 220A and a gate circuit 240A. The shift register 220A is made up of serially connected first, second and third D-type flip-flops 222, 224 and 226, that correspond to the first, the second and the third switching circuits 120, 130 and 140 shown in FIG. 2. The shift register 220A propagates changes in the input signal 210 that is inverted by an inverter 230 through the first, the second and the third D-type flip-flops 222, 224 and 226 in synchronism with the clock signal 212.

The gate circuit 240A shown in FIG. 4 generates control signals to be supplied to the control signal lines 126, 128, 136, 138, 146 and 148 shown in FIG. 2, based on an output from each stage of the shift register 200A and an enable signal. The gate circuit 240A may be made up of, for example, first, second and third NAND gates 241, 242 and 243, and first, second and third NOR gates 251, 252 and 253.

The control signal lines 126 and 128, that connect to the first switching circuit 120 having the minimum drivability, are connected to output terminals of the first NAND gate 241 and the first NOR gate 251, respectively. The first NAND gate 241 and the first NOR gate 251 both generate control signals based on an XQ output (an inverse signal of a Q output) of the first D-type flip-flop 222 and the enable signal 216. Also, the enable signal 216 is inverted by an inverter 232 and then inputted in the first NOR gate 251.

The control signal lines 136 and 138, that connect to the second switching circuit 130, are connected to output terminals of the second NAND gate 242 and the second NOR gate 252, respectively. The control signal lines 146 and 148, that connect to the third switching circuit 140, are connected to output terminals of the third NAND gate 243 and the third NOR gate 253, respectively.

The second and the third NAND gates 242 and 243 and the second and the third NOR gates 252 and 253 receive an XQ output (an inverse signal of a Q output) of the first D-type flip-flop 222 and the enable signal 216, as well as XQ outputs of the respectively corresponding D-type flip-flops 224 and 226. Also, the enable signal 216 is inverted by the inverter 232 and inputted in the second and the third NOR gates 252 and 253.

The operation of the predriver circuit will be described below with reference to the timing chart shown in FIG. 5. Time t1 through t3 and t1' through t3' shown in FIG. 5 concur with those shown in FIG. 3.

First, the description will be made with respect to the operation of the predriver circuit 200A when the enable signal 216 is in an active state (high level), and the input signal 210 changes from a low level to a high level at time t0. It is noted that the shift register 200A is reset to an initial state by a reset signal 214 prior to time t0.

At time t1, an XQ output from the first D-type flip-flop 222 changes from a low level to a high level. As a result, one of the input signals inputted in each of the first through the third NOR gates 251–253 changes to a high level, with the result that output signals from the first through the third NOR gates 251–253 simultaneously change to a low level. The output signals are supplied to the control signal lines 128, 138 and 148 shown in FIG. 2, respectively, with the result that the N-type MOS transistors 124, 134 and 144 shown in FIG. 2 are simultaneously turned off at time t1, as shown in FIG. 3.

At time t1, both of the two inputs to the first NAND gate 241 change to a high level, such that an output from the first NAND gate 241 changes from a high level to a low level. The output from the first NAND gate 241 is supplied to the control signal line 126 shown in FIG. 2. As a result, the P-type MOS transistor 122 shown in FIG. 2 is turned on at time t1, as shown in FIG. 3.

Next, an XQ output from the second D-type flip-flop 224 changes from a low level to a high level at time t2 that is one cycle of the clock signal 212 later than time t1. As a result, all the three inputs to the second NAND gate 242 change to a high level, such that an output from the second NAND gate 242 changes from a high level to a low level. The output from the second NAND gate 242 is supplied to the control signal line 136 shown in FIG. 2. As a result, the P-type MOS transistor 132 shown in FIG. 2 is turned on at time t2, as shown in FIG. 3.

Then, an XQ output from the third D-type flip-flop 226 changes from a low level to a high level at time t3 that is one cycle of the clock signal 212 later than time t2. As a result, three of the inputs to the third NAND gate 243 change to a high level, such that an output from the third NAND gate 243 changes from a high level to a low level. The output from the third NAND gate 243 is supplied to the control signal line 146 shown in FIG. 2. As a result, the P-type MOS transistor 142 shown in FIG. 2 is turned on at time t3, as shown in FIG. 3.

The predriver circuit 200A operates according to the timing chart shown in FIG. 5 when the input signal 210 changes from a high level to a low level at time t0'. Waveforms of the outputs from the first, the second and the third NAND gates 241, 242 and 243 shown in FIG. 5 concur with waveforms of the signals on the control signal lines 126, 136 and 146 shown in FIG. 3. Similarly, waveforms of the outputs from the first, the second and the third NOR gates 251, 252 and 253 shown in FIG. 5 concur with waveforms of the signals on the control signal lines 128, 138 and 148 shown in FIG. 3.

Accordingly, when the predriver circuit 200A shown in FIG. 4 is used, the output drive circuit 100A can be driven in a manner shown in FIG. 3.

Figure 6:
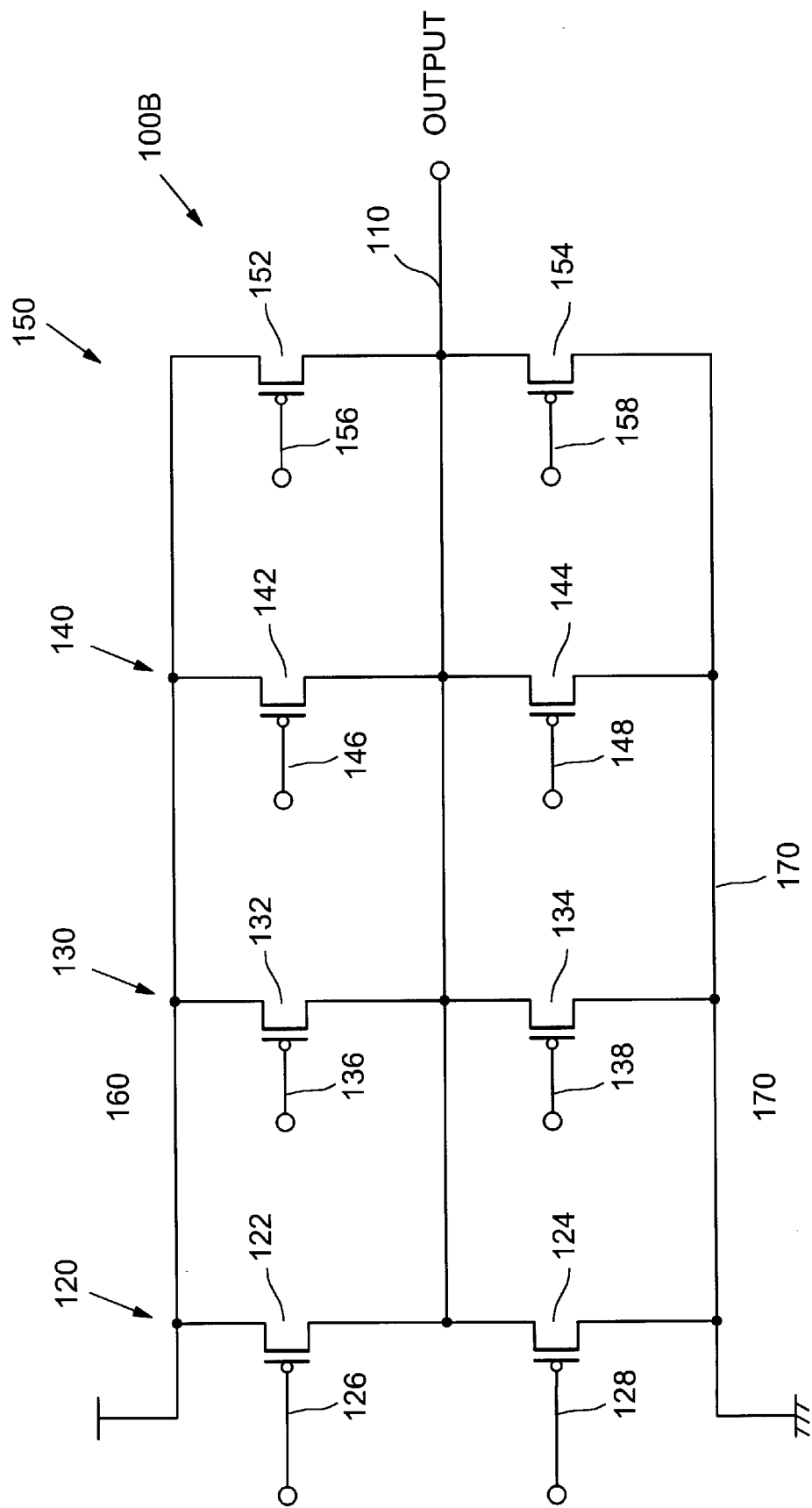
FIG. 6 shows a circuit diagram of an output drive circuit of output buffer circuit in accordance with a third embodiment of the present invention.

FIG. 6 shows an output drive circuit 100B, in accordance with a third embodiment of the present invention, that is provided in an output buffer circuit (including an output buffer circuit in an input/output buffer circuit) that performs a low speed data transmission in the devices shown in FIG. 1. The output drive circuit 100B shown in FIG. 6 includes a fourth switching circuit 150, in addition to the first, the second and the third switching circuits 120, 130 and 140 shown in FIG. 2. The fourth switching circuit 150 is also made up of a CMOS transistor. The CMOS transistor has a first switching device and a second switching device, namely, a P-type MOS transistor 152 and an N-type MOS transistor 154, respectively. Gates of the P-type MOS transistor 152 and the N-type MOS transistor 154 connect to control signal lines 156 and 158, respectively, that independently turn the respective transistors on and off.

When the P-type MOS transistors 122, 132, 142 and 152 have current drivabilities, P1, P2, P3 and P4, respectively, and the N-type MOS transistors 124, 134, 144 and 154 have current drivabilities, N1, N2, N3 and N4, respectively, the following relations are established:

$$P1 < P2 < P3 < P4, \text{ and } N1 < N2 < N3 < N4.$$

In order to differentiate the current drivabilities from one transistor to another, the gate width and/or the gate length may be changed, as described above.

In accordance with the third embodiment, the current drivability is gradually increased, in a similar manner as the first embodiment. As a result, the rise time and the fall time for low loads, and the rise time and the fall time for high loads can be limited within a predetermined standard range, for example, within a range of 75–300 ns for low speed transmission of the USB. Also, the signal level can be changed more smoothly, and the generation of noises is reduced.

Figure 7:
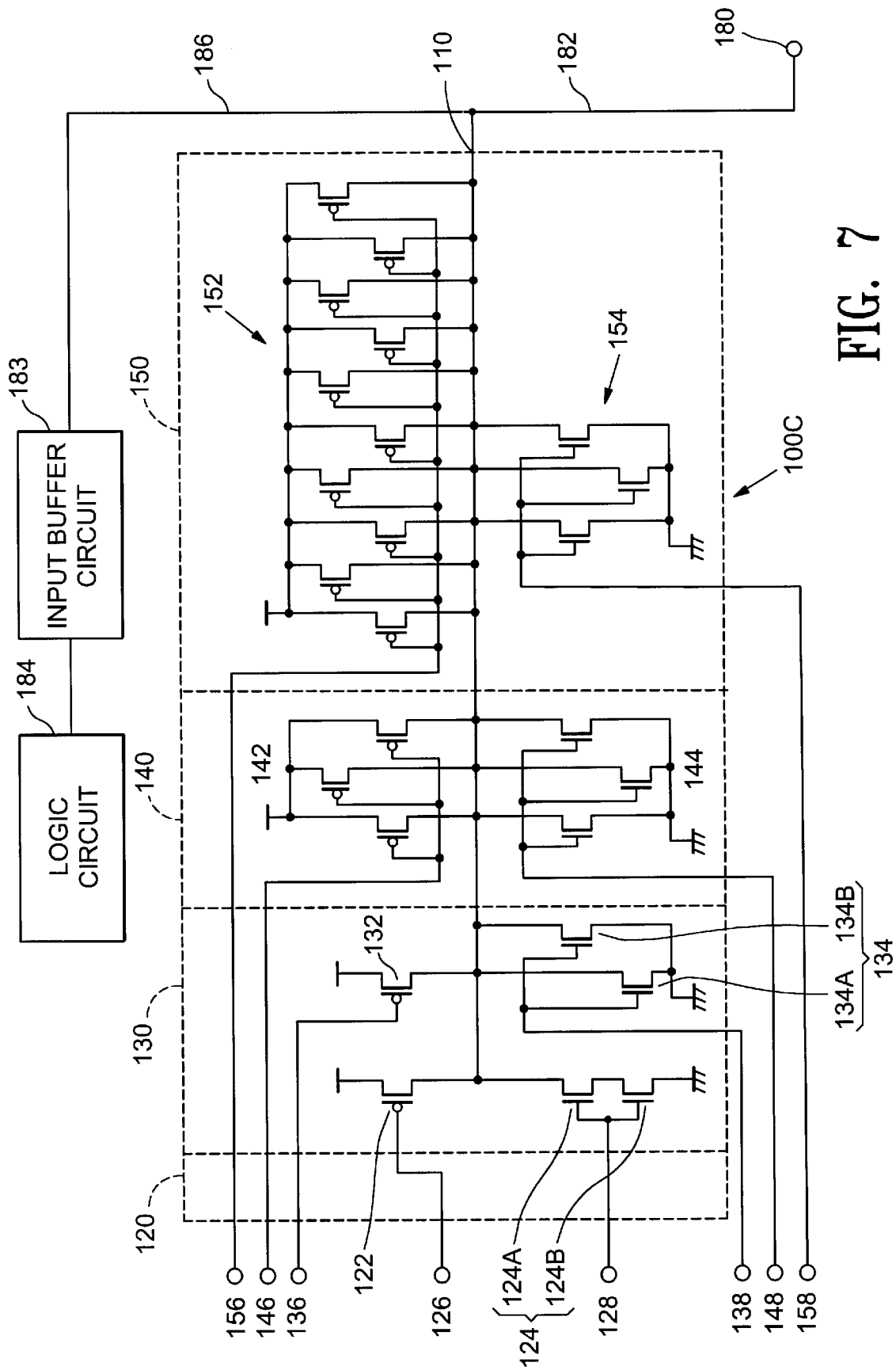
FIG. 7 shows a circuit diagram of an output drive circuit of output buffer circuit in accordance with a fourth embodiment of the present invention.

In accordance with a fourth embodiment of the present invention, the CMOS transistors in the first through the fourth switching circuits 120, 130, 140 and 150 shown in FIG. 6 are modified. FIG. 7 shows an output drive circuit 100C in which the modification is implemented. Referring to FIG. 7, a signal output line 110 of the output drive circuit 100C connects to an input/output signal line 182 that connects to an input/output terminal 180, and to an input signal line 186 that connects to a logic circuit 184 through an input buffer circuit 183. When the enable signal 216 becomes non-active and the output signal line 110 is placed in high impedance, a signal that is inputted through the input/output terminal 180 is supplied to the logic circuit 184 through the input buffer circuit 183.

Referring to FIG. 7, among first switching devices 122, 132, 142 and 152 and second switching devices 124, 134, 144 and 154 in the first through fourth switching circuits 120, 130, 140 and 150, some of them are composed of a plurality of P-type MOS transistors mutually connected in series or in parallel with one another or a plurality of N-type MOS transistors mutually connected in series or in parallel with one another.

Each of the MOS transistors shown in FIG. 7 has the same gate length of 0.6 μm. However, they have three different gate widths of 3, 5 and 10 μm.

For example, in the first switching circuit 120, an N-type MOS transistor 124A having the gate width of 5 μm and an N-type MOS transistor 124B having the gate width of 10 μm are connected in series to each other.

When two transistors having gate width W1 and W2, respectively, are connected in series, a composite gate width W of the two transistors is given by the following formula:

$$1/W = 1/W1 + 1/W2 \quad (1)$$

Therefore, a composite gate width W of the serially connected N-type MOS transistors 124A and 124B is given by:

$$1/W = 1/5 + 1/10 = 3/10.$$

The composite gate width W=3 μm.

Also, in the second switching circuit 130, for example, an N-type MOS transistor 134A having the gate width of 3 μm and an N-type MOS transistor 134B having the gate width of 3 μm are connected in parallel with each other.

When two transistors having gate width w1 and w2, respectively, are connected in parallel with each other, a composite gate width w of the two transistors is given by the following formula:

$$w = w1 + w2 \quad (2)$$

Therefore, a composite gate width W of the N-type MOS transistors 134A and 134B connected in parallel with each other is given by:

$$w = 3 + 3 = 6 \; \mu m$$

Table 1 below shows composite gate widths of the first switching devices (P-type MOS transistors) 122, 132, 142 and 152 and the second switching devices (N-type MOS transistors) 124, 134, 144 and 154 in the first through fourth switching circuits 120–150 that are calculated based on the formulas (1) and (2).

TABLE 1

|  | P-type MOS transistors | N-type MOS transistors |
| --- | --- | --- |
| First switching circuit | 10 μm | 3 μm |
| Second switching circuit | 10 μm | 6 μm |
| Third switching circuit | 30 μm | 13 μm |
| Fourth switching circuit | 90 μm | 30 μm |

Therefore, when the first switching devices 122, 132, 142 and 152 in the first through the fourth switching circuits 120, 130, 140 and 150 have current drivabilities, N1, N2, N3 and N4, respectively, and the second switching devices 124, 134, 144 and 154 have current drivabilities, P1, P2, P3 and P4, respectively, the following relations are established according to Table 1 above:

$$P1 = P2 < P3 < P4, \text{ and } N1 < N2 < N3 < N4$$

As shown in the fourth embodiment, two of the first switching devices 122, 132, 142 and 152 in the first through the fourth switching circuits 120, 130, 140 and 150 may be composed with the same current drivability. A similar arrangement is applicable to the second switching devices 124, 134, 144 and 154.

Figure 8:
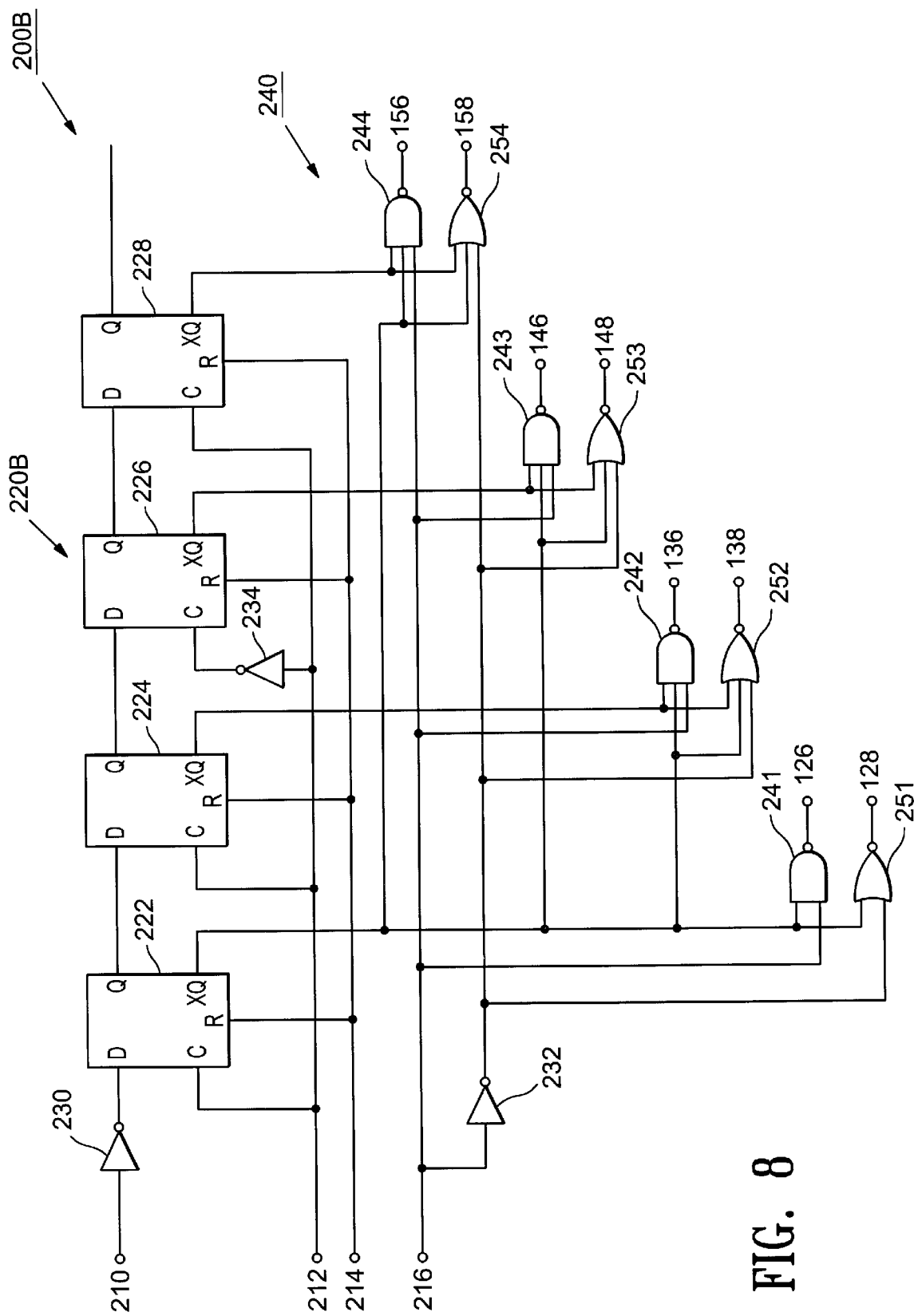
FIG. 8 shows a circuit diagram of a predriver circuit that can be used in pair with an output drive circuit shown in FIG. 6 or FIG. 7, in accordance with a fifth embodiment of the present invention.
Figure 9:
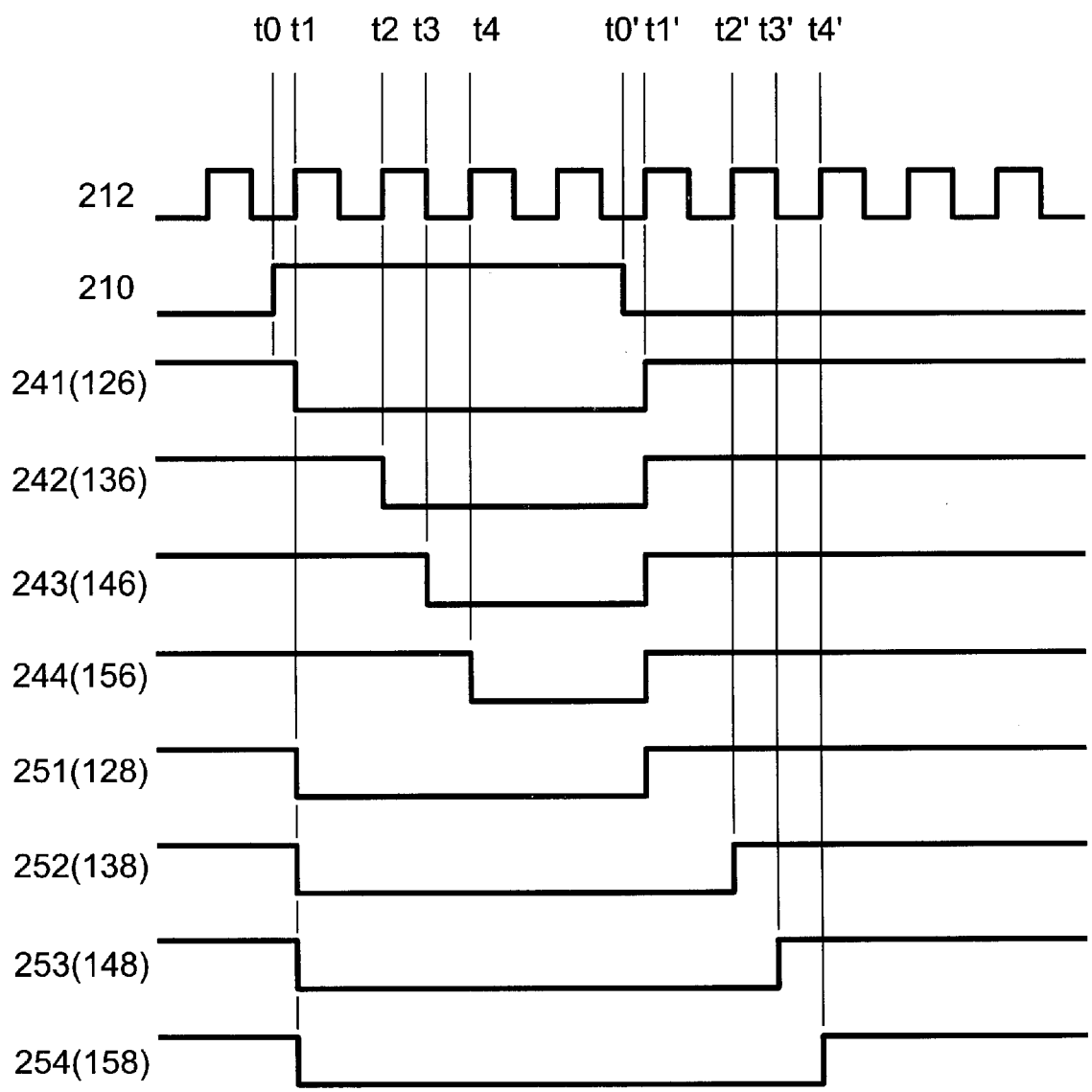
FIG. 9 is a timing chart of an operation of the predriver circuit shown in FIG. 8.

FIG. 8 shows a circuit diagram of a predriver circuit 200B that is used in pair with the output drive circuit 100C shown in FIG. 6 or the output drive circuit 100C shown in FIG. 7. FIG. 9 is a timing chart of an operation of the predriver circuit 200B.

The predriver circuit 200B shown in FIG. 8 is made up of a shift register 220B and a gate circuit 240B. A D-type flip-flop 228 is added to the last stage of the shift register 220A shown in FIG. 4 to form the shift register 220B. A fourth NAND gate 244 and a fourth NOR gate 254 are added to the gate circuit 240A shown in FIG. 4 to form the gate 240B.

Outputs XQ from the first and the fourth D-type flip-flops 222 and 228 and an enable signal 216 are inputted in the fourth NAND gate 244. An output from the fourth NAND gate 244 is supplied to the first control signal line 156 of the fourth switching circuit 150 shown in FIG. 6 or FIG. 7. Outputs XQ from the first and the fourth D-type flip-flops 222 and 228 and an enable signal 216 that is inverted by an inverter 232 are inputted in the fourth NOR gate 254. An output from the fourth NOR gate 254 is supplied to the second control signal line 158 of the fourth switching circuit 150 shown in FIG. 6 or FIG. 7.

Further, the predriver circuit 200B shown in FIG. 8 has an inverter 234 that inverts a clock signal 212. Clocks that are inverted by the inverter 234 are supplied to a clock terminal C of the third flip-flop 226.

FIG. 9 shows an input signal 210, a clock signal 212 and waveforms on the first and second control signal lines 126, 136, 146, 156, 128, 138, 148 and 158 shown in FIG. 8.

As shown in FIG. 9, when the input signal 210 changes from a low level to a high level at time t0, outputs from the first through the fourth NOR gates 251–254 are simultaneously turned to a low level at time t1, with the result that the second switching devices 124, 134, 144 and 154 shown in FIG. 6 or FIG. 7 are simultaneously turned off. Outputs from the first through the fourth NAND gates 241–244 are successively turned to a low level at times t1, t2, t3 and t4, respectively. As a result, the first switching devices 122, 132, 142 and 152 shown in FIG. 6 or FIG. 7 are successively turned on in this order, such that the current drivability of the output drive circuit 100B or 100C is gradually increased.

On the other hand, when the input signal 210 changes from a high level to a low level at time t0', outputs from the first through the fourth NAND gates 241–244 are simultaneously turned to a high level at time t1', with the result that the first switching devices 122, 132, 142 and 152 shown in FIG. 6 or FIG. 7 are simultaneously turned off. Also, outputs from the first through the fourth NOR gates 251–254 are successively turned to a high level at times t1', t2', t3' and t4', respectively. As a result, the second switching devices 124, 134, 144 and 154 shown in FIG. 6 or FIG. 7 are successively turned on in this order, such that the current drivability of the output drive circuit 100B or 100C is gradually increased.

In the predriver circuit 200B shown in FIG. 8, the inverter 234 is connected to the clock terminal C of the third D-type flip-flop 226. As a result, the time duration between time t1 and t2 and the time duration between time t1' and t2' are respectively one cycle of the clock signal 212. On the other hand, the time duration between time t2 and time t3, between time t3 and time t4, between time t2' and time t3', and between time t3' and time t4', is a half (½) cycle of the clock signal 212. For example, the clock signal 212 shown in FIG.

9 has a frequency of 12 MHz. In this case, one cycle of the clock signal 212 corresponds to 83.333 ns.

In this manner, a plurality of switching devices are successively turned on at predetermined time intervals, such that a time interval in which the switching devices with a higher current drivability are turned on is set to be shorter than a time interval in which the switching devices with a lower current drivability are turned on. As a result, sudden changes in the voltage level on the output signal line 110 are prevented, and the signal level can be shifted smoothly. In another embodiment, time intervals in the signal shift operation among all of the D-type flip-flops may be set at a half (½) cycle of the clock signal 212.

Figure 10:
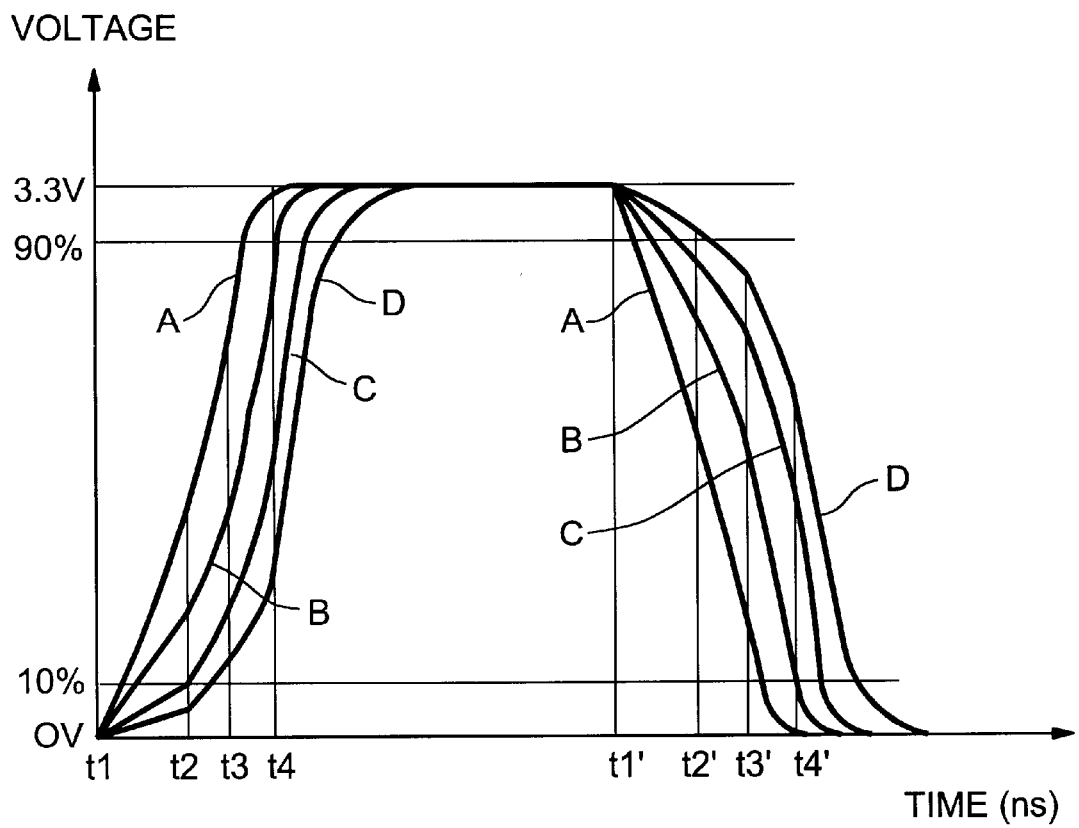
FIG. 10 shows waveforms representative of potentials on an output signal line that are obtained by driving the output drive circuit shown in FIG. 7 with signal waveforms shown in FIG. 9.

FIG. 10 shows signal level changes on the-signal output line 110 that take place when the output drive circuit 100B shown in FIG. 7 is driven by the predriver circuit 200B shown in FIG. 8.

FIG. 10 shows a signal level change characteristic A for a load capacitance 50 pf, a signal level change characteristic B for a load capacitance 100 pf, a signal level change characteristic C for a load capacitance 200 pf, and a signal level change characteristic D for a load capacitance 350 pf.

Rise time (during which the signal level rises from 10% of the wave height to 90% thereof) and fall time (during which the signal level falls from 90% of the wave height to 10% thereof) of each of the characteristics A–D are shown in Table 2 below.

TABLE 2

|  | Rise Time | Fall Time |
|---|---|---|
| Characteristic A | 112 ns | 113 ns |
| Characteristic B | 133 ns | 133 ns |
| Characteristic C | 143 ns | 141 ns |
| Characteristic D | 159 ns | 158 ns |

As shown above, the rise time and the fall time are brought within a range between 100 ns and 200 ns for the load capacitances of 50–350 pf, which is well within the USB standard range for low speed transmission of 75–300 ns.

An optimal clock frequency of the clock signal 212 may be 12 MHz to achieve the USB low speed transmission. Considering that the signal shift operation in the shift registers 220A and 220B takes place at a time interval of one cycle or a half cycle of the clock frequency, the time duration of one cycle may become too long if the clock frequency is lower than 12 MHz. When one cycle of the clock frequency is long, the number of stages of the switching circuits cannot be increased, which is a disadvantage. On the other hand, if the clock frequency is higher than 12 MHz, the signal level can rise or fall more smoothly. However, a higher clock frequency results in more expensive crystal oscillators. When the clock frequency is 12 MHz, the switching circuits may preferably be provided in two stages or more but five stages or less. The switching circuits in six or more stages can achieve a smooth signal level transition. However, this makes it difficult to bring the signal level to rise or fall within the upper time limit of the USB low speed transmission standard, that is 300 ns.

Figure 11:
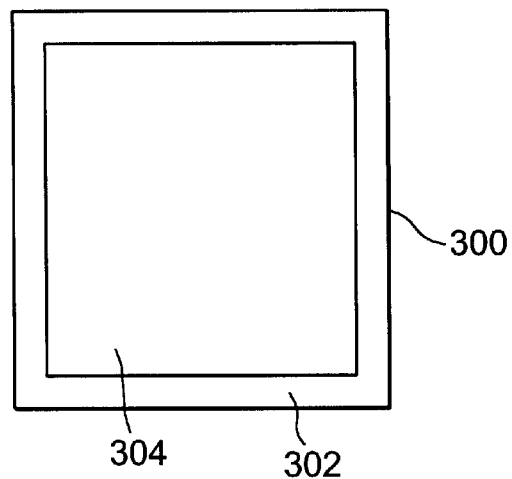
FIG. 11 is a plan view of a master slice type semiconductor device in accordance with a sixth embodiment of the present invention.

FIG. 11 shows a master slice type semiconductor device (gate array) 300, in accordance with a sixth embodiment of the present invention, with which any of the output buffer circuits in accordance with the embodiments described above. The semiconductor device 300 has an input/output circuit region 302 provided in a peripheral region and a logic circuit region 304 provided in a central region thereof.

The semiconductor device 300 is manufactured from a master slice. The master slice has plural pre-formed MOS transistors of different sizes, for example, with different gate widths of 3, 5, 10, 90 μm. The transistors are wired with one another and a power source is wired according to the user's specification to complete the semiconductor device 300.

Figure 14:
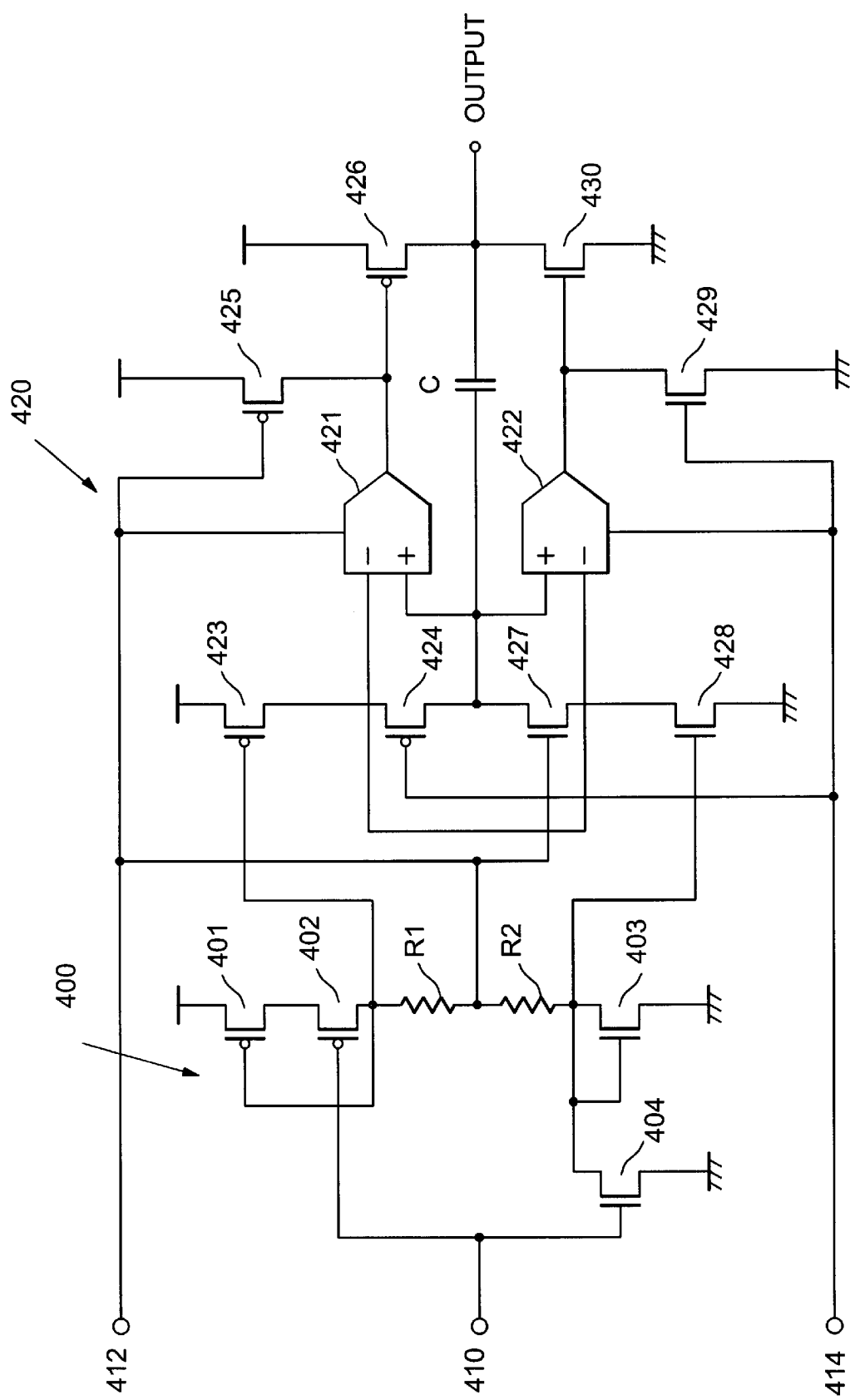
FIG. 14 shows a circuit diagram of a conventional output buffer circuit.

The input/output circuit region 302 includes at least an output buffer circuit in accordance with any one of the above-described embodiments. The output buffer circuit can be formed by wiring transistors of different sizes that are pre-formed on a master slice and wiring a power source thereto. Unlike the conventional circuit shown in FIG. 14, an output buffer circuit of the present invention does not require resistors R1 and R2 and a capacitor C with high precision. As a result, a semiconductor device having a built-in output buffer circuit can be manufactured by a master slice method without requiring a custom design. Accordingly, the design steps and costs for manufacturing semiconductor devices can be substantially reduced.

Figure 12:
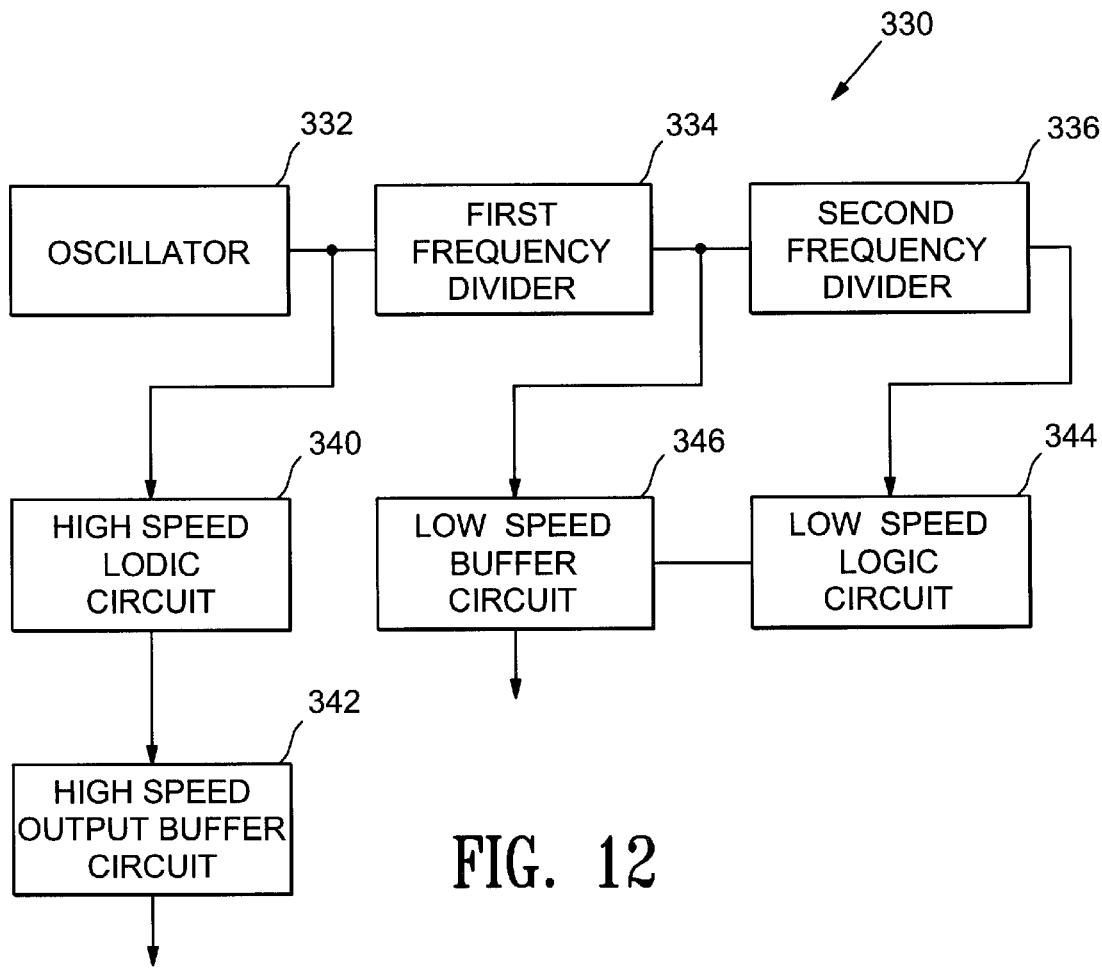
FIG. 12 shows a circuit diagram in part of an electronic apparatus having a high-speed output buffer circuit and a low speed output buffer circuit.
Figure 13:
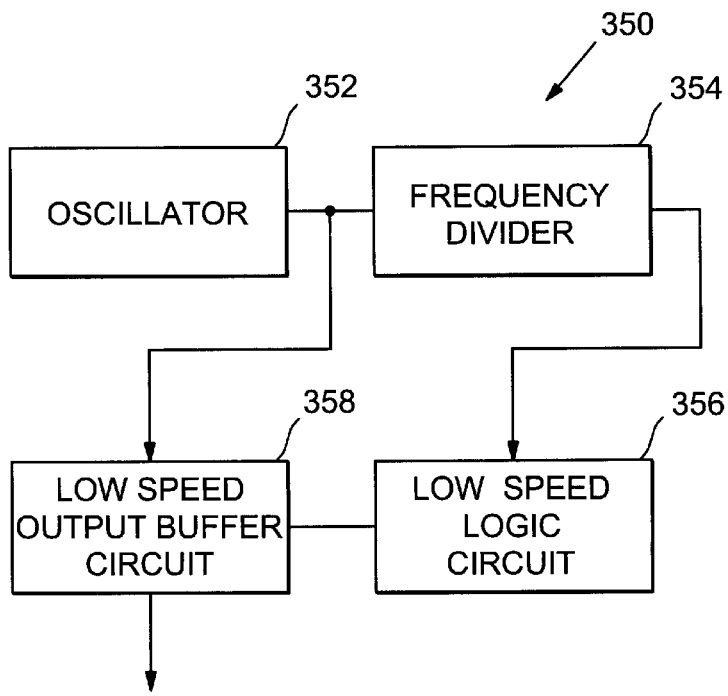
FIG. 13 shows a circuit diagram in part of an electronic apparatus having a low-speed output buffer circuit.

FIG. 12 and FIG. 13 respectively show schematic diagrams of electronic apparatuses that are composed by using the semiconductor device 300 shown in FIG. 11. FIG. 12 is a circuit diagram in part of an electronic device 330 having a high speed output buffer circuit 342 and a low speed output buffer circuit 346. The electronic apparatus 330 has, for example, an oscillator 332 that generates a frequency of, for example, 48 MHz, and first and second frequency dividers 334 and 336 that divide the frequency. The first frequency divider 334 provides an output at a frequency of 12 MHz, and the second frequency divider 336 provides an output at a frequency of 6 MHz.

A frequency of 48 MHz is normally used for a high speed logic circuit 340 to realize data transmission at the full speed (12 MHz) of the USB. The oscillator 332 generates this frequency. A frequency of 6 MHz is normally used for a low speed logic circuit 344 to realize data transmission at the low speed (1.5 MHz) of the USB. The second frequency divider 336 provides this frequency.

The first frequency divider 334 is used when the clock frequency of the clock signal 212, that is used for the low speed output buffer circuit 346, as described above, is 12 MHz. In this manner, in the case of the electronic apparatus 330 that has the high speed output buffer circuit 342, frequencies suitable for a low speed transmission can be generated by the frequency dividers 334 and 336 that divide an oscillation frequency of the oscillator 332.

FIG. 12 is a circuit diagram in part of an electronic apparatus 350 that performs only low speed transmission of the USB. In this case, an oscillator 352 generates a frequency of 12 MHz for a low speed output buffer circuit 358, and an oscillator 354 generates a frequency of 6 MHz for a low speed logic circuit 356.

The present invention is not limited to the embodiments described above, and a variety of modifications can be implemented within the scope of the subject matter of the present invention. For example, electronic apparatuses equipped with an output buffer circuit of the present invention include a gaming input device as one of a variety of man-machine interface devices, in addition to the one shown in FIG. 1.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive.

The scope of the invention is indicated by the appended claims, rather than the foregoing description, and all changes which come within the meaning and range of equivalency of the claims are therefore intended to be embraced therein.

What is claimed is:

1. An output buffer circuit comprising:
   a signal output line; and
   a plurality of switching circuits connected to the signal output line at different locations thereof,
   wherein each of the plurality of switching circuits comprises:
      a first switching device connected between a power source line and the signal output line;
      a second switching device connected between the signal output line and a ground line;
      a first control signal line that turns the first switching device on and off;
      a second control signal line that turns the second switching device on and off,
      wherein the first switching device and the second switching device in one of the plurality of switching circuits have a minimum current drivability, and the first switching device and the second switching device in another of the plurality of switching circuits have a maximum current drivability; and
      a predriver circuit that supplies a control signal to the first control signal line and the second control signal line of each of the plurality of switching circuits based on an input signal and a clock signal,
      wherein, when the potential on the output signal line is turned to a high level, the predriver circuit turns on the first switching device in the switching circuit having the minimum current drivability, and then turns on the first switching device in the other switching circuits in the order from one having a lower current drivability, and
      wherein, when the potential on the output signal line is turned to a low level, the predriver circuit turns on the second switching device in the switching circuit having the minimum current drivability, and then turns on the second switching device in the other switching circuits in the order from one having a lower current drivability,
      wherein the plurality of switching devices are successively turned on at time intervals, wherein at least the last one of the time intervals is shorter than the first one of the time intervals.

2. An output buffer circuit according to claim 1, wherein the plurality of switching circuits include another switching circuit formed from the first switching device and the second switching device having a current drivability equal to one of the minimum current drivability and the maximum current drivability or a current drivability between the minimum current drivability and the maximum current drivability.

3. An output buffer circuit according to claim 2, wherein, in at least one of the plurality of switching circuits, the CMOS transistor has a high current drivability that is attained by connecting a plurality of the P-type MOS transistors and/or the N-type MOS transistors in parallel with one another.

4. An output buffer circuit according to claim 1, wherein the first switching device and the second switching device disposed in each of the plurality of switching circuits are formed from at least one P-type MOS transistor and at least one N-type MOS transistor, respectively, to thereby compose a CMOS transistor.

5. An output buffer circuit according to claim 4, wherein the CMOS transistors in the respective switching circuits having different current drivabilities have different transistor sizes.

6. An output buffer circuit according to claim 5, wherein, in at least one of the plurality of switching circuits, the CMOS transistor has a low current drivability that is attained by connecting a plurality of the P-type MOS transistors and/or the N-type MOS transistors in series to one another.

7. An output buffer circuit comprising:
   a signal output line; and
   a plurality of switching circuits connected to the signal output line at different locations thereof,
   wherein each of the plurality of switching circuits comprises:
      a first switching device connected between a power source line and the signal output line;
      a second switching device connected between the signal output line and a ground line;
      a first control signal line that turns the first switching device on and off;
      a second control signal line that turns the second switching device on and off,
      wherein the first switching device and the second switching device in one of the plurality of switching circuits have a minimum current drivability, and the first switching device and the second switching device in another of the plurality of switching circuits have a maximum current drivability; and
      a predriver circuit that supplies a control signal to the first control signal line and the second control signal line of each of the plurality of switching circuits based on an input signal and a clock signal,
      wherein, when the potential on the output signal line is turned to a high level, the predriver circuit turns off all the second switching devices in the plurality of switching circuits, and simultaneously turns on the first switching device in the switching circuit having the minimum current drivability, and then turns on the first switching device in the other switching circuits in the order from one having a lower current drivability, and
      wherein, when the potential on the output signal line is turned to a low level, the predriver circuit turns off all the first switching devices in the plurality of switching circuits and simultaneously turns on the second switching device in the switching circuit having the minimum current drivability, and then turns on the second switching device in the other switching circuits in the order from one having a lower current drivability,
      wherein an enable signal is inputted in the predriver circuit, wherein when the enable signal is non-active, the first switching device and the second switching device in all of the switching circuits are simultaneously turned off to set the signal output line in a high impedance,
      wherein the predriver circuit has a shift-register composed of a plurality of serially connected D-type flip-flops corresponding to the plurality of switching circuits,
      wherein the shift-register transmits a change in the input signal, based on clocks synchronized with the clock signal, from one of the D-type flip-flops in a first stage to one of the D-type flip flops in a last stage,
      wherein the control signal, that is generated based on an output from the D-type flip flop in the first stage and the enable signal, is supplied to the first and the second control signal lines of the switching circuit having the minimum drivability, and wherein the first and the second control signal lines of each of the switching circuits other than the switching circuit having the minimum drivability are supplied with the control signal that is generated based on an output from the D-type flip-flop in the first stage, an output from a corresponding one of the D-type flip-flops and the enable signal, wherein the plurality of switching devices are successively turned on at time intervals, in which a normal phase and a reverse phase of a clock are respectively inputted in adjacent two of the D-type flip-flops, such that a signal shift operation between the two D-type flip-flops takes place at a half cycle of the clock, wherein at least the last one of the time intervals is shorter than the first one of the time intervals.

8. An output buffer circuit according to claim 7, wherein the plurality of switching circuits include another switching circuit formed from the first switching device and the second switching device having a current drivability equal to one of the minimum current drivability and the maximum current drivability or a current drivability between the minimum current drivability and the maximum current drivability.

9. An output buffer circuit according to claim 8, wherein, in at least one of the plurality of switching circuits, the CMOS transistor has a high current drivability that is attained by connecting a plurality of the P-type MOS transistors and/or the N-type MOS transistors in parallel with one another.

10. An output buffer circuit according to claim 7, wherein the first switching device and the second switching device disposed in each of the plurality of switching circuits are formed from at least one P-type MOS transistor and at least one N-type MOS transistor, respectively, to thereby compose a CMOS transistor.

11. An output buffer circuit according to claim 10, wherein the CMOS transistors in the respective switching circuits having different current drivabilities have different transistor sizes.

12. An output buffer circuit according to claim 11, wherein, in at least one of the plurality of switching circuits, the CMOS transistor has a low current drivability that is attained by connecting a plurality of the P-type MOS transistors and/or the N-type MOS transistors in series to one another.

13. An output buffer circuit according to claim 7, wherein the plurality of switching devices are successively turned on at time intervals, wherein at least the last one of the time intervals is shorter than the first one of the time intervals.

14. A master slice type semiconductor device comprising an output buffer circuit comprising:

a signal output line; and a plurality of switching circuits connected to the signal output line at different locations thereof, wherein each of the plurality of switching circuits comprises:

a first switching device connected between a power source line and the signal output line;

a second switching device connected between the signal output line and a ground line;

a first control signal line that turns the first switching device on and off;

a second control signal line that turns the second switching device on and off, wherein the first switching device and the second switching device in one of the plurality of switching circuits have a minimum current drivability, and the first switching device and the second switching device in another of the plurality of switching circuits have a maximum current drivability; and a predriver circuit that supplies a control signal to the first control signal line and the second control signal line of each of the plurality of switching circuits based on an input signal and a clock signal, wherein, when the potential on the output signal line is turned to a high level, the predriver circuit turns off all the second switching devices in the plurality of switching circuits, and simultaneously turns on the first switching device in the switching circuit having the minimum current drivability, and then turns on the first switching device in the other switching circuits in the order from one having a lower current drivability, and wherein, when the potential on the output signal line is turned to a low level, the predriver circuit turns off all the first switching devices in the plurality of switching circuits and simultaneously turns on the second switching device in the switching circuit having the minimum current drivability, and then turns on the second switching device in the other switching circuits in the order from one having a lower current drivability, wherein the plurality of switching devices are successively turned on at time intervals, wherein at least the last one of the time intervals is shorter than the first one of the time intervals; and wherein the output buffer circuit is formed by wiring a plurality of transistors of different sizes pre-formed on a master slice.

15. An electronic apparatus comprising a master slice type semiconductor device comprising an output buffer circuit, comprising:

a signal output line; and a plurality of switching circuits connected to the signal output line at different locations thereof, wherein each of the plurality of switching circuits comprises:

a first switching device connected between a power source line and the signal output line;

a second switching device connected between the signal output line and a ground line;

a first control signal line that turns the first switching device on and off;

a second control signal line that turns the second switching device on and off, wherein the first switching device and the second switching device in one of the plurality of switching circuits have a minimum current drivability, and the first switching device and the second switching device in another of the plurality of switching circuits have a maximum current drivability; and a predriver circuit that supplies a control signal to the first control signal line and the second control signal line of each of the plurality of switching circuits based on an input signal and a clock signal, wherein, when the potential on the output signal line is turned to a high level, the predriver circuit turns off all the second switching devices in the plurality of switching circuits, and simultaneously turns on the first switching device in the switching circuit having the minimum current drivability, and then turns on the first switching device in the other switching circuits in the order from one having a lower current drivability, and wherein, when the potential on the output signal line is turned to a low level, the predriver circuit turns off all the first switching devices in the plurality of switching circuits and simultaneously turns on the second switching device in the switching circuit having the minimum current drivability, and then turns on the second switching device in the other switching circuits in the order from one having a lower current drivability, wherein the plurality of switching devices are successively turned on at time intervals, wherein at least the last one of the time intervals is shorter than the first one of the time intervals; and wherein the output buffer circuit is formed by wiring a plurality of transistors of different sizes pre-formed on a master slice; and wherein the electronic apparatus is used as an output interface.

* * * * *